(12) United States Patent
Hamberger

(10) Patent No.: US 10,483,031 B2
(45) Date of Patent: Nov. 19, 2019

(54) CIRCUIT ARRANGEMENT FOR REDUCING A MAGNETIC UNIDIRECTIONAL FLUX COMPONENT IN THE CORE OF A TRANSFORMER

(71) Applicant: SIEMENS AKTIENGESELLSCHAFT, Munich (DE)

(72) Inventor: Peter Hamberger, Kirchschlag bei Linz (AT)

(73) Assignee: Siemens Aktiengesellschaft, Munich (DE)

( * ) Notice: Subject to any disclaimer, the term of this patent is extended or adjusted under 35 U.S.C. 154(b) by 114 days.

(21) Appl. No.: 15/561,382

(22) PCT Filed: Feb. 22, 2016

(86) PCT No.: PCT/EP2016/053617
§ 371 (c)(1),
(2) Date: Sep. 25, 2017

(87) PCT Pub. No.: WO2016/155944
PCT Pub. Date: Oct. 6, 2016

(65) Prior Publication Data
US 2018/0082781 A1    Mar. 22, 2018

(30) Foreign Application Priority Data

Apr. 1, 2015 (EP) ..................................... 15162172

(51) Int. Cl.
*H01F 27/02* (2006.01)
*H01F 27/42* (2006.01)
(Continued)

(52) U.S. Cl.
CPC ............. *H01F 27/42* (2013.01); *H01F 27/02* (2013.01); *H01F 27/34* (2013.01); *G01R 33/02* (2013.01);
(Continued)

(58) Field of Classification Search
USPC .................... 361/15; 323/249, 250, 253, 356
See application file for complete search history.

(56) References Cited

U.S. PATENT DOCUMENTS 8,896,306 B2    11/2014    Hamberger et al.
2004/0196675 A1    10/2004    Cope et al.
(Continued)

FOREIGN PATENT DOCUMENTS

CN    102037525    4/2011
CN    103270561    8/2013
(Continued)

*Primary Examiner* — Danny Nguyen
(74) *Attorney, Agent, or Firm* — Cozen O'Connor

(57) ABSTRACT

A circuit arrangement for reducing a magnetic unidirectional flux component in a core of a transformer includes a measuring device that provides a sensor signal corresponding to the magnetic unidirectional flux component, a compensation coil magnetically coupled to the core of the transformer, and a semiconductor switching device which is electrically arranged in a current path in series with the compensation coil to feed a current into the compensation coil, such that current is directed opposite the unidirectional flux component, where the semiconductor switching device is controlled via a control signal provided by a controller, and includes an inductive voltage divider having a first impedance component arranged in a current circuit in series with the compensation coil and the semiconductor switching device and a second impedance component arranged in
(Continued)

parallel with the semiconductor switching device, where the first impedance component is connected in parallel with a parallel resonant circuit.

9 Claims, 1 Drawing Sheet

(51) Int. Cl.
    *H01F 27/34*     (2006.01)
    *G05F 1/33*     (2006.01)
    *H01F 27/38*     (2006.01)
    *H01F 27/25*     (2006.01)
    *G05F 1/32*     (2006.01)
    *H01F 29/14*     (2006.01)
    *G01R 33/02*     (2006.01)

(52) U.S. Cl.
    CPC ............... *G05F 1/32* (2013.01); *G05F 1/33* (2013.01); *H01F 27/25* (2013.01); *H01F 27/38* (2013.01); *H01F 2029/143* (2013.01)

(56) References Cited

U.S. PATENT DOCUMENTS

| | | | |
|---|---|---|---|
| 2010/0194373 A1* | 8/2010 | Hamberger | ............ H01F 27/34 323/356 |
| 2013/0049751 A1 | 2/2013 | Hamberger et al. | |
| 2013/0201592 A1 | 8/2013 | Hamberger et al. | |

FOREIGN PATENT DOCUMENTS

| | | |
|---|---|---|
| CN | 103270562 | 8/2013 |
| CN | 103403830 | 11/2013 |

* cited by examiner

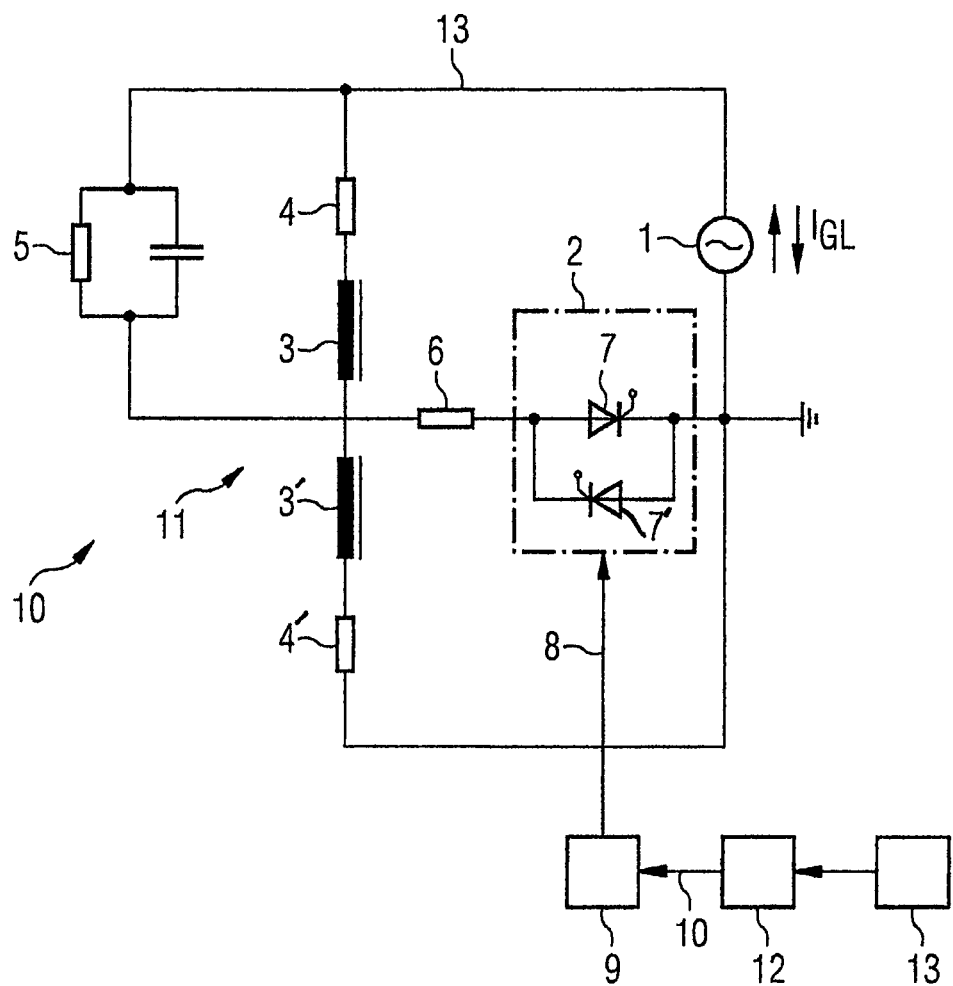

CIRCUIT ARRANGEMENT FOR REDUCING A MAGNETIC UNIDIRECTIONAL FLUX COMPONENT IN THE CORE OF A TRANSFORMER

CROSS-REFERENCE TO RELATED APPLICATIONS

This is a U.S. national stage of application No. PCT/EP2016/053617 filed 22 Feb. 2016. Priority is claimed on European Application No. 15162172.9 filed Apr. 1, 2015, the content of which is incorporated herein by reference in its entirety.

1. FIELD OF THE INVENTION

The invention relates to a circuit arrangement for reducing a magnetic unidirectional flux component in the core of a transformer, with a measuring device that provides a sensor signal corresponding to the magnetic unidirectional flux component, with a compensation coil that is magnetically coupled to the core of the transformer, with a semiconductor switching device that is electrically arranged in a current path in series with the compensation coil to feed a current into the compensation coil, the effect of which current being directed opposite to the unidirectional flux component, where the semiconductor switching device can be controlled via a control variable provided by a controller.

2. DESCRIPTION OF THE RELATED ART

It is well known in the case of electrical transformers, as employed in power distribution grids, that an undesirable feed of a direct current can occur into the primary winding or the secondary winding, respectively. A direct current feed of this type, also referred to below as a dc component, can emanate from electronic circuit elements, for example, such as are used at present during activation of electrical drives or likewise in reactive component compensation. Another cause can be "geomagnetically induced currents" (GIC).

A dc component results, in the core of the transformer, in a unidirectional flux component that is superimposed on the alternating flux. This results in an asymmetrical driving of the magnetic material in the core and brings with it a number of disadvantages. Even a direct current of a few amperes can cause local heating in the transformer which can adversely affect the service life of the winding insulation. A further undesirable effect is increased noise emission during the operation of the transformer. This is perceived to be troublesome in particular when the transformer is installed in the vicinity of a residential area.

It is proposed in PCT/EP2010/064397, by using a semiconductor switching device which is connected in series with a compensation coil in a current circuit, and while using the voltage induced in the compensation coil, to generate a pulsating direct current which on average compensates for the undesirable injected direct current component. PCT/EP2010/054857 discloses a sensor device that can be used for measuring the unidirectional flux component, for example.

The use of a dc compensation of this type with a semiconductor switching device is limited to the maximum permissible voltage or current respectively of the power electronics circuit elements used. Depending on the design of the compensation coil the following problem arises: if the number of turns in the compensation coil is kept low then the semiconductor switching device must generate a large compensation current, which is accompanied by a correspondingly large production of heat in the circuit elements. If a compensation coil with a high number of turns is employed, on the other hand, then the voltage induced in the compensation coil rapidly reaches the maximum permissible voltage limit for the semiconductor switches used.

In the practical application of dc compensation with semiconductors, this means that when using the circuit elements available at the present time, its employment is restricted to an induced voltage in the compensation coil of something less than 700 V (low-voltage guideline).

But the problem of dc compensation also exists in the case of large transformers, in particular in the case of so-called HVDCT transformers in which the voltage induced in the compensation coil can lie far above 700 V.

SUMMARY OF THE INVENTION

The object of the present invention is to provide a circuit arrangement for reducing a direct component of a magnetic flux in a transformer which, in its practical employment, is also applicable to transformers over a very large power range.

This and other objects and advantages are achieved in accordance with the invention by a circuit arrangement in which the electrical voltage induced in the compensation coil is lowered by using an inductive voltage divider such that presently available conventional semiconductor circuit elements can be used for the semiconductor switching device without their maximum permissible voltage being exceeded. The application range for dc compensation with the aid of a semiconductor switching device is therefore also opened up to power transformers in the very high power category. In particular, dc compensation is then also possible for HVDCT transformers. The inductive voltage divider used in accordance with the invention consists of a series connection of impedances. A first impedance is arranged in a current circuit in series with the compensation coil and the semiconductor switching device, where the first impedance is connected in parallel with a parallel resonant circuit. A second impedance is arranged in parallel with the semiconductor switching device. The two impedances are established in accordance with the voltage divider rule such that the voltage is lowered at the semiconductor switching device so that presently available conventional semiconductor circuit elements can be employed.

Activation of the semiconductor switching device can be implemented as in PCT/EP2010/064397 referred to in the introduction. As disclosed there, the induced voltage is utilized for generating a compensation current that can be fed into the compensation coil bidirectionally. Switching-on of individual circuit elements of the semiconductor switching device is effected synchronously with the power grid and in line with a predetermined switching strategy. The switch-on time point is triggered by the phase of the voltage induced in the compensation coil, and the on-period is directed in accordance with a sensor signal that is provided by a measuring device. With this, a sinusoidal pulsating direct current is fed into the compensation coil, the level of which is limited by a current-limiting device. An external energy source, i.e., a battery or a capacitor, is not required to generate this pulsating direct current. The duration of current flow of this pulsating direct current can be adjusted in a simple manner and very precisely in accordance with the supplied sensor signal, which predetermines the direction and level of the dc component to be compensated. The average value of the pulsed direct current generated in this way causes a reduction in the unidirectional flux component in the soft magnetic core of the transformer or completely cancels out its effect in the core, respectively. As a result, the undesirable asymmetrical driving of the soft magnetic core referred to in the introduction no longer occurs. The consequence is that the thermal load on the winding of the transformer is lower. When the transformer is in operation, losses and noise are lower. In this regard, the device can be implemented with comparatively simple means. In this regard, both discrete and/or programmable modules that are commercially available can be used. It is highly advantageous in this regard that an energy store, such as a battery or capacitor, is not required for generating the compensation current $I_{GL}$. In other words, the energy for generating the compensation current $I_{GL}$ is taken directly from the compensation coil. The circuit arrangement has a high level of reliability due to its simplicity. It is well suited to the low-maintenance, long-term operation of a transformer in a power distribution grid. The range of applications encompasses both transformers in the low or medium voltage range as well as very high power transformers (HVDCT transformers). Neither constructional size nor safety-related devices, nor other design criteria of the transformer, are unfavorably influenced by employment of the invention.

For the purpose of limiting current, an inductor is arranged in the current path in series with the semiconductor switching device and the compensation coil. The advantage of using an inductor in the current path lies simply in the fact that the coil current of the compensation coil corresponds to the time integral of the coil voltage and therefore, via a suitable control strategy, direct components of this voltage integral and therefore of the coil current are achievable in a simple manner over a period. Given a corresponding choice of the inductor, the load during switching-on can be kept very low because the change in the current over time at the moment of switching on is limited by the inductor. Fundamentally another two-pole circuit element could also be used in place of the inductor. In circuit engineering terms an ohmic resistor would also be conceivable although its active-power losses would be a drawback.

In a preferred embodiment, the parallel resonant circuit has a resonance frequency that is tuned to the power-line frequency of the transformer. It therefore has a blocking action for alternating current but not for the transient direct current, i.e., compensation current. The parallel resonant circuit has a very high impedance (an infinitely high impedance in the theoretical ideal case) for power-line frequency. For currents with other frequencies, the impedance falls rapidly depending on quality.

It is preferable that a blocking impedance is connected in series with the first impedance and a blocking impedance is connected in series with the second impedance. The inductor has the effect that the inductance to the parallel branch can be adjusted individually.

In a preferred embodiment, the semiconductor switching device is controlled by a control signal provided by a controller such that the current ($I_{GL}$) flowing in the current path is a pulsating direct current and automatically switches off the semiconductor switching device when the current ($I_{GL}$) in the current path is zero or almost zero. The thyristor enters the blocking state at current zero. As a result, a direct current is produced with superimposed harmonics.

In a preferred embodiment, the semiconductor switching device is formed from two antiparallel-connected thyristors, such as a gate turn-off thyristor (GTO) or an insulated gate bipolar transistor (IGBT). The advantage of using a thyristor lies firstly in the fact that a thyristor can be "fired up", i.e., put into the conducting state, with a current pulse. During the positive half-oscillation of the line voltage, the thyristor has the property of a diode until the next current zero. The end of the duration of current flow is brought about by the thyristor itself in that the current falls below the holding current and the thyristor automatically "goes out", i.e, enters the non-conducting state. Naturally, other semiconductor switches, such as GTO, IGBT transistors, or other circuit elements are also conceivable.

It can be helpful if the semiconductor-semiconductor switching device and the control device are arranged outside the tank of a transformer. As a result the entire electronic circuit is accessible from outside for inspection and maintenance.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

For the further explanation of the invention, reference is made in the following part of the description to the drawing from which further advantageous embodiments, details, and developments of the invention can be taken based on a non-restrictive exemplary embodiment, in which:

The FIGURE is an exemplary embodiment of the inventive switching device in accordance with the invention.

DETAILED DESCRIPTION OF THE EXEMPLARY EMBODIMENTS

The FIGURE a shows simplified schematic block diagram of a switching device 10 in accordance with an exemplary embodiment of the invention. The switching device 10 consists essentially of an inductive voltage divider 11 that consists of a first impedance, impedance 3, and a second impedance, impedance 3'. In this regard, the first impedance 3 is connected in a current path 13 in series with the semiconductor switching device 2 and the compensation coil 1. In the FIGURE the compensation coil 1 is drawn with the symbol for a voltage source. The voltage induced in the compensation coil 1 forms the total voltage of the voltage divider 3, 3'. The first and second impedances 3, 3' are arranged on a magnetic core and differ in terms of their number of turns. By a suitable implementation of the first and second impedances 3, 3', for example, by a suitable choice of the number of turns, the partial voltages at the inductive resistances 3 or 3' respectively can be structured correspondingly (voltage divider rule). In accordance with the invention, the partial voltage at the second resistance 3' is chosen such that the maximum permissible voltage for the circuit elements 7 and 7' respectively used in the semiconductor switching device 2 is lowered so that a permissible maximum voltage value is not exceeded. Only a very low excitation current flows across the first and second impedances 3, 3'.

So that no significant current flows across the first and second impedances 3 and 3' respectively (this would be equivalent to a loss in the generation of the compensation current), one blocking impedance 4 and 4' in each case is connected to each of the first and second impedances 3 and 3', respectively. These blocking impedances 4 and 4' respectively are larger than the impedance of the inductor of the parallel resonant circuit 5. The blocking impedance 4 or 4' respectively can be a magnet coil or an air-cored coil.

As evident from the circuit diagram in the FIGURE, a parallel resonant circuit 5 is connected in parallel with the upper impedance 3. The parallel resonant circuit consists of an inductor and a capacitor connected in parallel. The two circuit elements are dimensioned in terms of their resonance frequency such that the parallel resonant circuit 5 forms a blocking circuit for the power-line frequency of the transformer, i.e., its resistance for alternating current is very large (impedance is blocking). For direct current on the other hand, its resistance is low. If one of the two thyristors 7 or 7' respectively of the semiconductor switching device 2 is then switched through, then the result is the development of a compensation current $I_{GL}$ (direct current), the current path of which lies across the choke of the parallel resonant circuit 5. For example, if the thyristor 7 shown at the top in the function block 2 in FIG. 1 is triggered, the result is the development of a compensation current $I_{GL}$ that flows anticlockwise in the current path 13 and is fed into the compensation coil 1 from bottom to the top in the FIGURE. The direction of the compensation current $I_{GL}$ reverses when the lower thyristor 7' in the function block 2 is triggered so that the compensation current $I_{GL}$ is fed clockwise via the inductor of the parallel resonant circuit 5 into the compensation coil 1 (arrow from top to bottom in this case in the FIGURE).

The inventive circuit arrangement enables a bidirectional current flow $I_{GL}$ in the compensation coil 1 so that the troublesome unidirectional flux component in the core 13 of the transformer can be compensated for. The outcome is that this compensation means that the asymmetrical driving of the magnetic material, with the negative effects presented in the introduction in terms of noise development and local heating, no longer occurs.

As shown in the FIGURE, a current-limiting reactor 6 is connected in the current path 13 for the purpose of limiting current.

Activation of the semiconductor switching device 2 is effected via a control signal 8 that is provided by a controller 9. The controller 9 receives on its input side the signal from a magnetic field measuring device 11 which detects the magnetic unidirectional flux component in the core 13 of a transformer. In this regard, the control signal 8 takes account of the size and direction of the unidirectional flux component detected.

As explained in PCT/EP2010/064397 referred to in the introduction, the compensation current $I_{GL}$ has the form of a sequence of adjacent sinusoidal half-waves that are interrupted by current gaps, where each half-wave is symmetrical to half the period of oscillation of the induced voltage.

In summary, the invention also enables direct current compensation for very large power transformers. For example, the problem-solving approach disclosed in PCT/EP2010/064397 can also be employed with presently available conventional semiconductor circuit elements even when the voltage induced in the compensation coil lies far above 700 V.

Although the invention has been closely illustrated and described in detail by the preferred exemplary embodiment presented above, the invention is not restricted by the examples disclosed and other variations can be derived from same by a person skilled in the art without departing from the scope of protection of the invention.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A circuit arrangement for reducing a magnetic unidirectional flux component in a core (13) of a transformer, comprising:
   a measuring device which provides a sensor signal corresponding to the magnetic unidirectional flux component;
   a compensation coil which is magnetically coupled to the core of the transformer;
   a semiconductor switching device which is electrically arranged in a current path in series with the compensation coil to feed a current into the compensation coil, such that current is directed opposite to the magnetic unidirectional flux component, the semiconductor switching device being controlled via a control signal provided by a controller;
   an inductive voltage divider comprising:
      a first impedance component arranged in a current circuit in series with the compensation coil and the semiconductor switching device, said first impedance component being connected in parallel with a parallel resonant circuit;
      a second impedance component which is arranged in parallel with the semiconductor switching device.

2. The circuit arrangement as claimed in claim 1, wherein the parallel resonant circuit (5) has a resonance frequency which is tuned to a power-line frequency of the transformer.

3. The circuit arrangement as claimed in claim 1, further comprising:
   a first blocking impedance connected in series with the first impedance; and
   a second blocking impedance connected in series with the second impedance.

4. The circuit arrangement as claimed in claim 2, further comprising:
   a first blocking impedance connected in series with the first impedance; and
   a second blocking impedance connected in series with the second impedance.

5. The circuit arrangement as claimed in claim 1, wherein the semiconductor switching device is controlled by the control signal provided by the controller such that the current flowing in the current path is a pulsating direct current and automatically switches off the semiconductor switching device when the current in the current path is zero or almost zero.

6. The circuit arrangement as claimed in claim 5, wherein the pulsating direct current is formed from periodically recurring half-waves and from current gaps connecting adjacent half-waves.

7. The circuit arrangement as claimed in claim 6, wherein the semiconductor switching device is formed from a plurality of antiparallel-connected thyristors.

8. The device as claimed in claim 7, wherein the semiconductor switching device (2) is arranged outside a transformer tank.

9. The circuit arrangement as claimed in claim 7, wherein the plurality of two antiparallel-connected thyristors comprise one of Gate Turn-off Thyristors (GTO) and Insulated Gate Bipolar Transistors (IGBTs).

* * * * *